United States Patent
Potter et al.

(10) Patent No.: US 6,538,422 B2
(45) Date of Patent: Mar. 25, 2003

(54) VOLTAGE SENSOR BUSHING ASSEMBLY WITH INTEGRAL CAPACITANCE SCREEN

(75) Inventors: David E. Potter, Chicago, IL (US); Timothy J. Mulligan, Glenview, IL (US); James A. Rutkowski, Chicago, IL (US); Roy T. Swanson, La Grange Park, IL (US); Daniel M. Terhune, Chicago, IL (US)

(73) Assignee: S & C Electric Co., Chicago, IL (US)

( * ) Notice: Subject to any disclaimer, the term of this patent is extended or adjusted under 35 U.S.C. 154(b) by 0 days.

(21) Appl. No.: 09/833,537

(22) Filed: Apr. 12, 2001

(65) Prior Publication Data

US 2001/0048308 A1 Dec. 6, 2001

Related U.S. Application Data

(60) Provisional application No. 60/199,704, filed on Apr. 26, 2000.

(51) Int. Cl.$^7$ .......................... G01R 19/14; G01R 27/26
(52) U.S. Cl. ........................................ 324/133; 324/126
(58) Field of Search .................................. 324/519, 133, 324/134, 127, 395; 218/134; 314/126; 439/950, 951; 361/306.1, 321.6

(56) References Cited

U.S. PATENT DOCUMENTS 5,585,611 A * 12/1996 Harvey et al. ............... 218/134
6,031,368 A * 2/2000 Klippel et al. .............. 324/126

* cited by examiner

Primary Examiner—Christine Oda
Assistant Examiner—James Kerveros
(74) Attorney, Agent, or Firm—James V. Lapacek

(57) ABSTRACT

A voltage sensing apparatus includes an output for a voltage tap point that is useful in representing the voltage on a conductor that passes through the voltage sensing apparatus. The voltage sensing apparatus also performs the function of a separable insulated conductor, e.g. a conventional bushing or bushing insert as utilized in the electrical power distribution field. The voltage sensing apparatus includes a molded body having an embedded capacitance screen that provides the output. The body is molded about the capacitance screen. An arrangement is provided for locating the capacitance screen within the molded body. In a preferred embodiment, the capacitance screen is molded from a conductive plastic preferably formed with an open mesh or screen structure that permits the free flow of molding material.

7 Claims, 3 Drawing Sheets

VOLTAGE SENSOR BUSHING ASSEMBLY WITH INTEGRAL CAPACITANCE SCREEN

This application claims the benefit of U.S. Provisional Application No. 60/199,704 filed on Apr. 26, 2000.

BACKGROUND OF THE INVENTION

1. Field of the Invention

The present invention relates generally to voltage sensing apparatus and more particularly to a bushing assembly that includes an integral capacitance screen.

2. Description of Related Art

Various apparatus have been proposed for use in making electrical connections and for sensing electrical parameters such as voltage and current in medium-voltage electrical power distribution systems. For example, this apparatus is useful to provide electrical connections and also to provide data for automated distribution systems, phasing information, troubleshooting of faulted cables, etc. Some of these arrangements utilize separable insulated connectors on power cables while others provide receiving passages through which the energized electrical cables are passed, e.g. see ANSI/IEEE Standard 386. Still other arrangements provide coupling/sensor assemblies that interfit with the conventional test point caps of elbows for cable terminations. Some of these devices utilize transformers, pick-up coils, resistive dividers and capacitive coupling to sense circuit parameters. One device, available from Lindsey Manufacturing Company of Azusa, Calif. as the Elbow Sense ™ Voltage Monitoring Plug, utilizes a voltage monitoring plug that replaces the standard plug on 600 ampere elbow assemblies, commonly referred to as "T-body" elbows. This arrangement utilizes a precision resistive voltage divider to provide an output proportional to line-to-ground voltage. Another device available from Lindsey Manufacturing Co. is a VSB Voltage Sensing Bushing that utilizes a capacitive voltage divider. This interface bushing device is arranged to be directly affixed to a switchgear tank or the like, replacing the existing bushing that interfits with the cable-terminating elbow devices such as the 600 ampere T-body components.

Devices which capacitively couple to the test point of an elbow connector are exemplified by U.S. Pat. Nos. 4,814,933, 5,077,520 and 5,095,265.

Arrangements which utilize electrodes spaced from a cable or conductor are shown in U.S. Pat. Nos. 3,970,932, 3,991,367, 4,074,193, 4,823,022, 5,051,733, 5,521,567, 5,726,390 and 6,031,368. The bushing with voltage tap of the aforementioned U.S. Pat. No. 5,726,390 utilizes an annular plastic member with a layer of conductive lacquer. A connector extends from a leg of the annular member to the exterior of the bushing.

Another type of voltage sensor, shown in U.S. Pat. No. 4,002,976, utilizes a capacitor having one end directly in contact with a high voltage terminal and a step-down transformer in series with the capacitor, the output of the secondary of the step-down transformer providing a voltage proportional to the terminal voltage.

While these various arrangements are generally useful, it would be desirable to provide a voltage sensing bushing that is economical to manufacture, exhibits improved strength and is less susceptible to environmental ingress.

SUMMARY OF THE INVENTION

Accordingly, it is a principal object of the present invention to provide a voltage sensing apparatus with an integral capacitance screen having a predetermined pattern of openings.

It is another object of the present invention to provide a voltage sensing apparatus that is formed via a molding process about a polymeric capacitance screen having a generally open structure.

It is a further object of the present invention to provide a capacitance screen that is molded from a conductive polymer and including a predetermined pattern of openings.

These and other objects of the present invention are efficiently achieved by a voltage sensing apparatus including a voltage tap point that is useful in representing the voltage on a conductor that passes through the voltage sensing apparatus. The voltage sensing apparatus also performs the function of a separable insulated conductor or the like, e.g. a conventional bushing or bushing insert as utilized in the electrical power distribution field. The voltage sensing apparatus includes a molded body having an embedded capacitance screen that provides the output. The body is molded about the capacitance screen. An arrangement is provided for locating the capacitance screen within the molded body. In a preferred embodiment, the capacitance screen is molded from a conductive plastic preferably formed with an open mesh or screen structure that permits the free flow of molding material.

BRIEF DESCRIPTION OF THE DRAWING

The invention, both as to its organization and method of operation, together with further objects and advantages thereof, will best be understood by reference to the specification taken in conjunction with the accompanying drawing in which.

DETAILED DESCRIPTION

Figure 1:
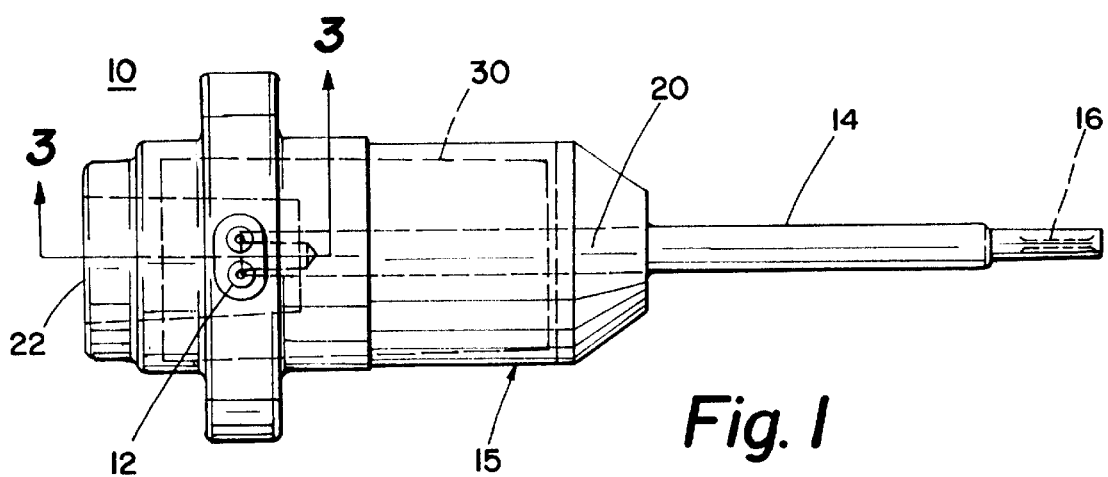
FIG. 1 is an elevational view of a voltage sensing apparatus in accordance with the present invention.
Figure 2:
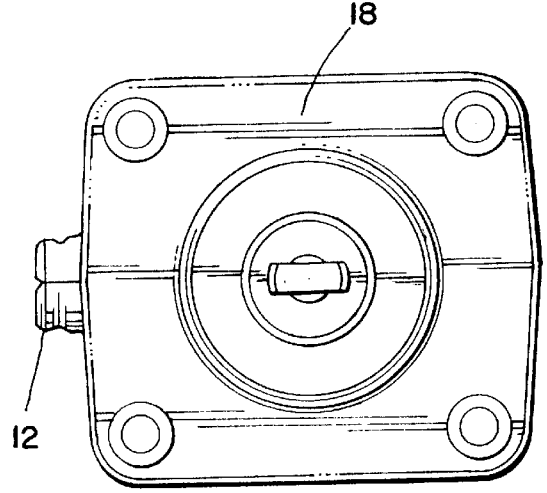
FIG. 2 is a right-side elevational view of the voltage sensing apparatus of FIG. 1.
Figure 3:
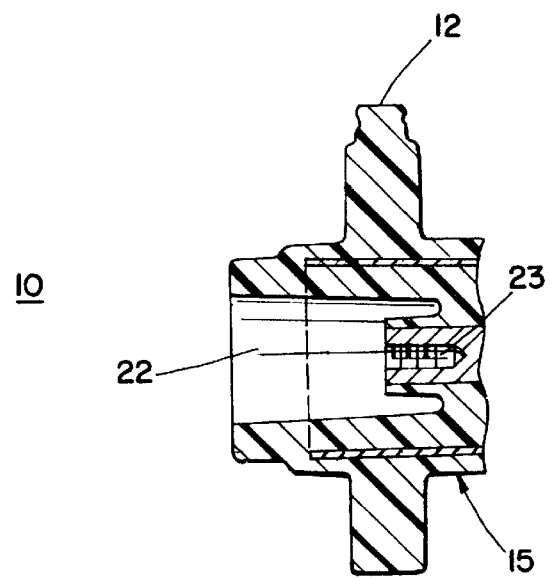
FIG. 3 is a sectional view taken along the line 3—3 of FIG. 1.

Referring now to FIGS. 1–3, the voltage sensing apparatus 10 of the present invention provides at output 12 a voltage tap point useful in representing the voltage on the conductor 14. The voltage sensing apparatus 10 also performs the function of a bushing or bushing insert, e.g. per ANSI/IEEE Standard 386, and includes a molded body 15, a connection terminal at 16, mounting provisions at 18, a central conductor rod 20 of the conductor 14 and a receiving arrangement 22. For example, in the specific illustration of FIGS. 1–3, the voltage sensing apparatus 10 functions as a bushing well with internal threads at 23 for receiving a bushing insert. However, it should also be realized that the voltage sensing apparatus 10 in another specific arrangement is formed as a integral bushing with the receiving arrangement 22 arranged to interfit with an elbow.

In accordance with important aspects of the present invention, the voltage sensing apparatus 10 includes an integrally embedded capacitance screen 30 that provides the output 12. The body 15 is molded about the capacitance screen 30 along with the features 16, 18 and 20 to provide the overall voltage sensing apparatus 10. For example, in a specific arrangement the voltage sensing apparatus 10 is formed in a molding operation with the body 15 being formed from an electrically insulating material such as an epoxy resin, elevated temperature-curing polymeric compound, e.g. cycloaliphatic epoxy resin. In a specific illustration, the output 12 is provided via two terminal posts 25, 27 extending from the capacitance screen 30 and formed from a conductive material, e.g. brass or the like in specific arrangements material to provide a suitable capacitance element, e.g. conducive plastic in a preferred embodiment when disposed about the energized conductor 20.

Figure 4:
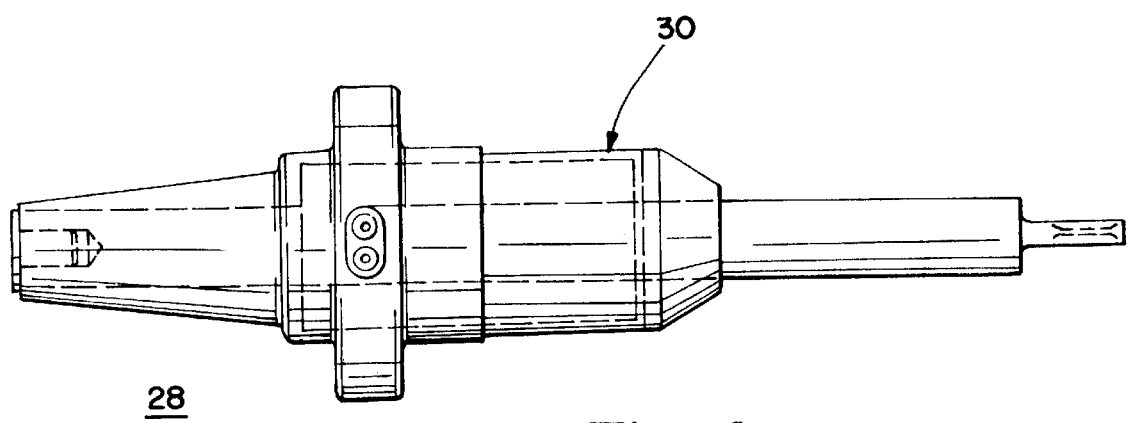
FIG. 4 is an elevational view of another form of the voltage sensing apparatus of the present invention illustrating the function of an integral bushing.

In another specific illustration of the present invention and with additional reference now to FIG. 4, a voltage sensing apparatus 28 is provided with the capacitance screen capacitance screen 30 to provide a 600 ampere bushing according to the aforementioned ANSI/IEEE Standard 386.

Figure 5:
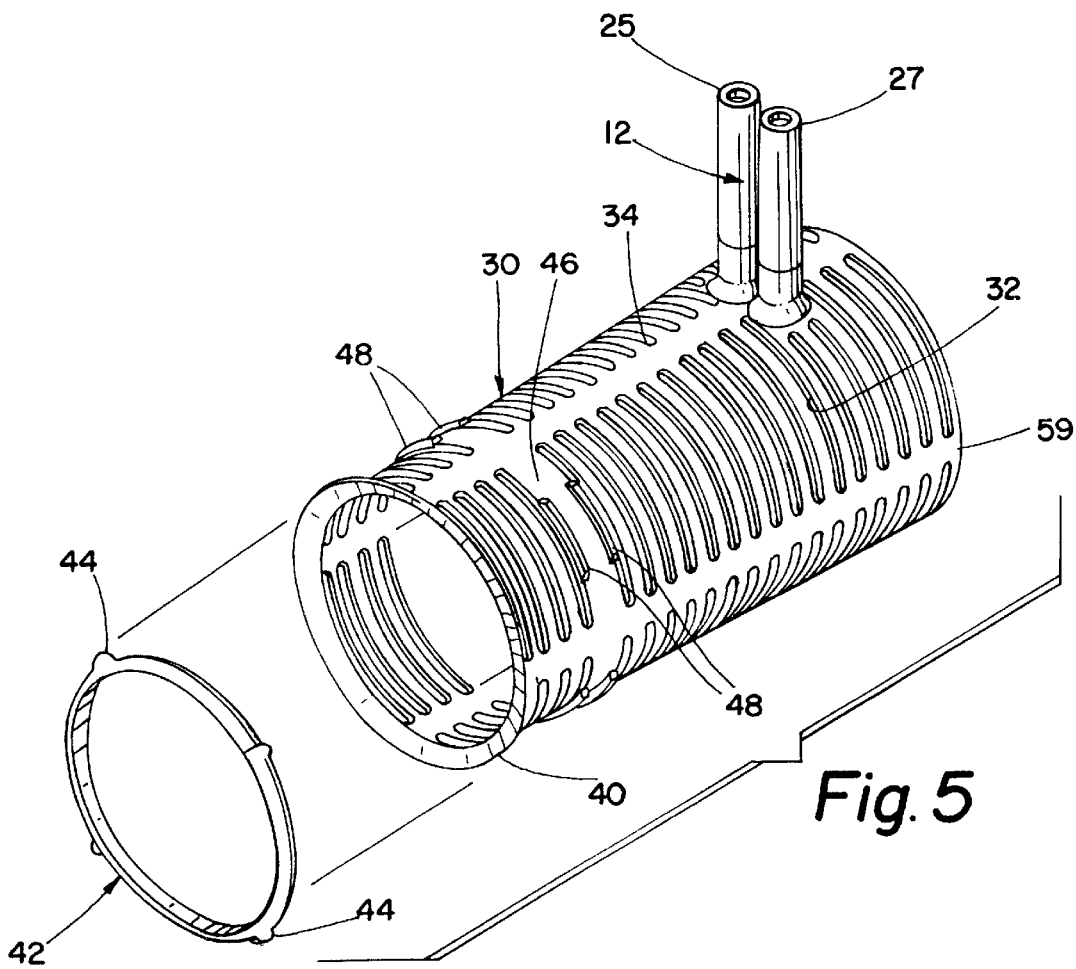
FIG. 5 is a perspective view of a capacitance screen and a locator element of the present invention utilized in the voltage sensing apparatus of FIGS. 1–4.
Figure 6:
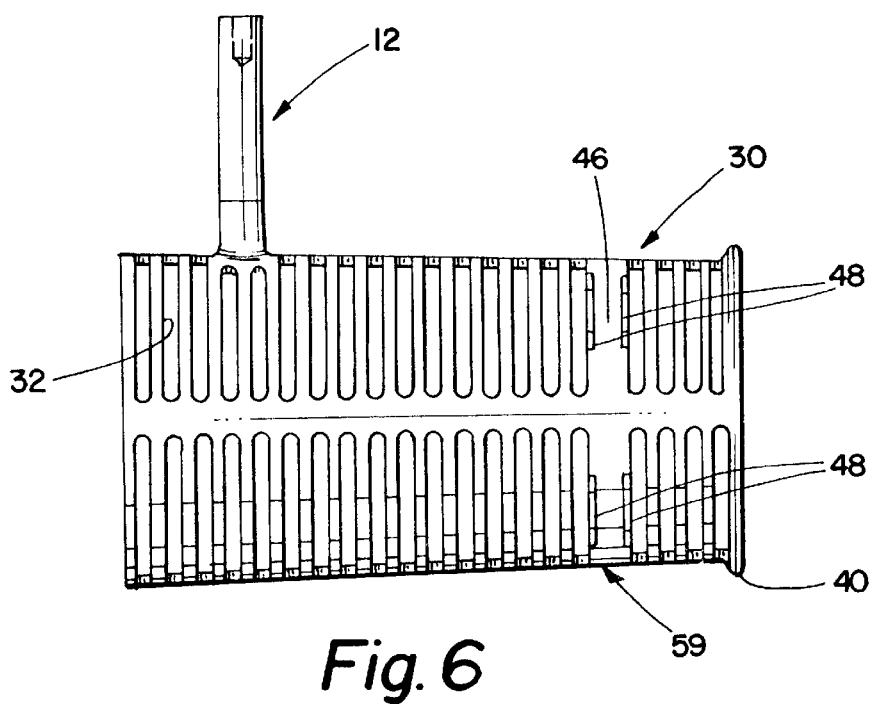
FIG. 6 is a top plan view of the capacitance screen of FIG. 5.

Referring now additionally to FIGS. 5–6, the capacitance screen 30 includes an overall generally cylindrical shape and is preferably formed with an open mesh or screen structure, e.g. by defined openings or elongate slots 32, 34, for ease of incorporation into the apparatus body 15 and improved fabrication during the molding of the voltage sensing apparatus 10. For example, such an open structure of the capacitance screen 30 permits the free flow of the material of the body 15 through the capacitance screen 30. In one specific embodiment, it has been found useful to fabricate the capacitance screen 30 with a ratio of open areas to solid areas of approximately 1/1. The capacitance screen 30 also preferably includes a slight taper in order to facilitate removal after molding. In one specific fabrication process, the capacitance screen 30 is molded utilizing a central core piece (not shown) surrounded by two outer semicircular portions (not shown) that define the open structure features, e.g. 32, 34.

In a preferred embodiment, the capacitance screen 30 is molded from a conductive plastic that includes a conductive filler, e.g. nickel-coated graphite filler in nylon. In some regards, this material is preferable for fabricating the capacitance screen than aluminum or the like since it is less rigid and thus exhibits less stress to the molding material of the body 15.

Prior to molding, preferably the capacitance screen 30 is coated with a conductive coating, preferably power black coating or the like, e.g. as available from the O'Brien company under the designation RFB-601-S7 Conductive Coating. It has been found that after the molding, if any gap does occur, the coating separates from the capacitance screen 30 and adheres to the inner portions of the body 15 surrounding the screen and is effective to control corona effects at this interface, i.e. by creating the gap at the exterior surface of the capacitance screen 30 rather than at the polymer surface of the body 15.

In accordance with additional aspects of the present invention, the capacitance screen also provides electrical stress grading or distribution when installed as a bushing, cable termination or the like. In that regard, the conductive coating 59 acts to round the corners of the various structural features of the capacitance screen, e.g. at 32, 34. Preferably, the capacitance screen 30 includes an outwardly flared rim 40 to control and reduce electrical field stress thereat.

In cooperation with the capacitance screen 30, a location arrangement is provided via cooperation with a locating ring 42 that includes extending circumferentially arranged rounded locating tabs 44 to assist in locating the capacitance screen 30 within the body 15. In a specific illustration, the ring 42 is elastic and is disposed over the outside of the capacitance screen 30, e.g. at 46 as shown in FIG. 5. In a specific illustration, the capacitance screen 30 includes ribs 48, the ribs 48 being formed around the periphery of the capacitance screen 30 so as to form protuberances therefrom. The ribs 48 define a pattern of spaced apart protuberances for appropriately positioning the ring 42 on the capacitance screen 30. The location arrangement serves to center and align the capacitance screen 30 within the body 15 of the voltage sensing apparatus 10 during the molding thereof.

Figure 7:
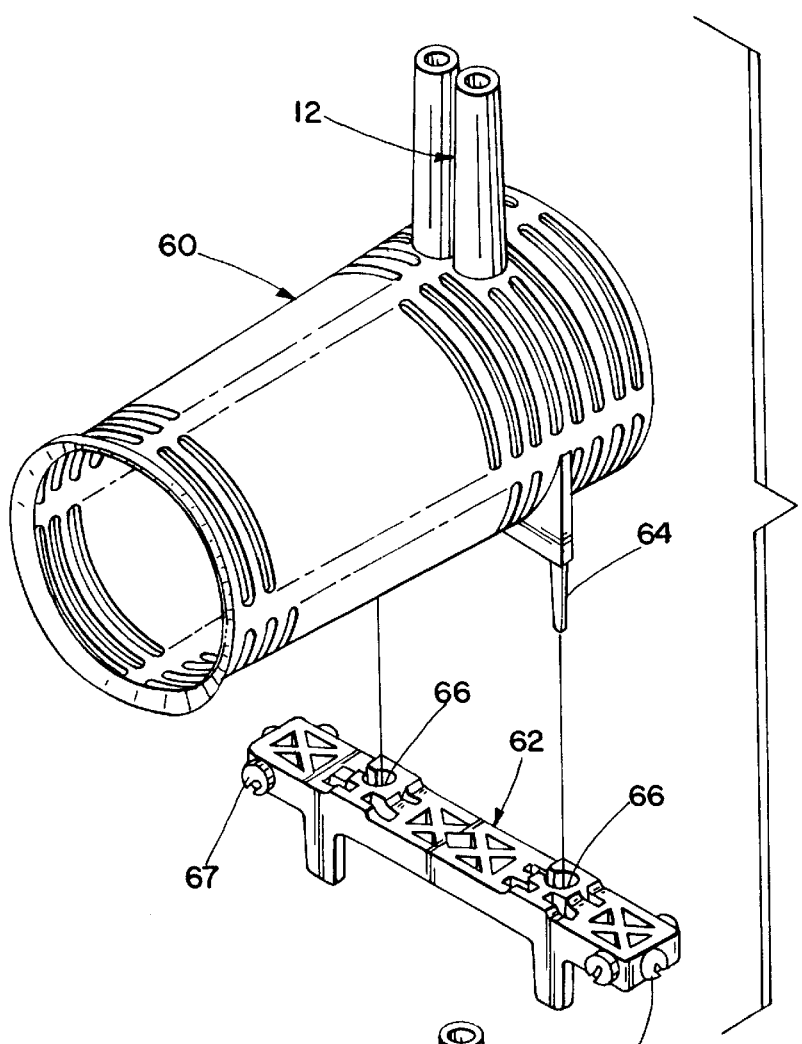
FIGS. 7 and 8 are alternate arrangements of a capacitance screen and location features of the present invention.
Figure 8:
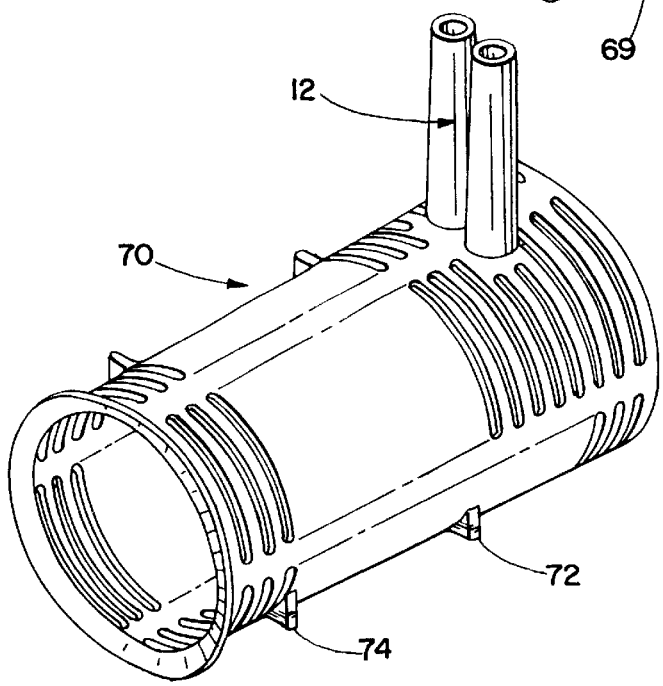

In accordance with additional aspects of the present invention and with additional reference now to FIGS. 7 and 8, two additional specific illustrations for locating the capacitance screen within the voltage sensing apparatus 10 are shown. For example, the capacitance screen 60 of FIG. 7 cooperates with a locating device 62 that includes apertures 66 for receiving locating pins 64 of the capacitance screen 60 for appropriate alignment of the capacitance screen 60 within the voltage sensing apparatus 10 during the molding thereof, the locating device 62 being incorporated into the voltage sensing apparatus during molding. In a specific illustration, the locating device includes protrusions at 67, 69 for location during the molding process. In FIG. 8, a capacitance screen 70 is formed with locating features 72 that extend from the generally cylindrical periphery of the capacitance screen 70. However, it is believed that the arrangements of FIGS. 5–7 are preferable to the arrangement of FIG. 8 regarding the handling and finishing of the voltage sensing apparatus 10 after molding with respect to minimizing any possibilities of leakage paths that might be caused by gaps between the capacitance screen 30 and the coating thereon.

The two terminal posts 25, 27 are utilized to determine the continuity of the capacitance screen 30 as described in more detail in U.S. Pat. Nos. 5,521,567 and 5,910,775.

While there have been illustrated and described various embodiments of the present invention, it will be apparent that various changes and modifications will occur to those skilled in the art. Accordingly, it is intended in the appended claims to cover all such changes and modifications that fall within the true spirit and scope of the present invention.

What is claimed is:

1. Voltage sensing apparatus comprising:
   insulating body means molded from a molding material and including a central conductive rod;
   a capacitance screen disposed within said insulating body means and around said central conductive rod during the molding thereof, said capacitance screen being fabricated from a polymeric conductive material and including a pattern of predetermined openings; and
   an electrical connection extending from said capacitance screen and a predetermined point on the periphery of said insulating body means.

2. The voltage sensing apparatus of claim 1 wherein said capacitance screen further comprises means for locating said capacitance screen within the voltage sensing apparatus.

3. The voltage sensing apparatus of claim 2 wherein said locating means comprises a ring of elastic material that is disposed about the capacitance screen.

4. The voltage sensing apparatus of claim 3 wherein said ring includes extending tabs circumferentially arranged around the exterior of the ring.

5. The voltage sensing apparatus of claim 3 wherein said capacitnace screen further comprises a pattern of spaced apart protuberances formed around the exterior of the capacitance screen for positioning the ring.

6. The voltage sensing apparatus of claim 2 further comprising means cooperating with said locating means and being molded within said voltage sensing apparatus.

7. A method of fabricating a voltage sensor assembly comprising the steps of molding a capacitance screen from a polymeric conductive material in a generally cylindrical shape having a predetermined area of openings, and molding an insulating body about said capacitance screen.

* * * * *